United States Patent [19]

Yokota et al.

[11] Patent Number: 5,635,859
[45] Date of Patent: Jun. 3, 1997

[54] LEVEL CONVERTING CIRCUIT

[75] Inventors: Noboru Yokota; Noriaki Kogawa, both of Kawasaki, Japan

[73] Assignee: Fujitsu Limited, Kawasaki, Japan

[21] Appl. No.: 25,766

[22] Filed: Mar. 3, 1993

[30] Foreign Application Priority Data

Mar. 10, 1992 [JP] Japan ..................... 4-051794

[51] Int. Cl.$^6$ ............................................. H03K 19/0175
[52] U.S. Cl. ..................... 326/67; 326/34; 326/83
[58] Field of Search ..................... 307/475, 451, 307/455, 456

[56] References Cited

U.S. PATENT DOCUMENTS

| 4,797,583 | 1/1989 | Ueno et al. ........................ | 307/475 |
| 4,841,175 | 6/1989 | De Man ............................ | 307/455 |
| 5,068,551 | 11/1991 | Bosnyak ........................... | 307/455 |
| 5,148,061 | 9/1992 | Hsueh et al. ...................... | 307/475 |
| 5,241,225 | 8/1993 | Okajima et al. .................... | 307/475 |

*Primary Examiner*—Edward P. Westin
*Assistant Examiner*—Andrew Sanders
*Attorney, Agent, or Firm*—Staas & Halsey

[57] ABSTRACT

The present invention provides a level converting circuit comprising: a differential output transistor circuit for amplifying a difference between two mutually complementary input logic signals; a first output transistor circuit for outputting an inverted output logic signal based on a signal output by the differential output transistor circuit; and a second output transistor circuit for outputting an uninverted output logic signal based on a signal output by the differential output transistor circuit, wherein the first output transistor circuit further comprises first and second field-effect transistors and the second output transistor circuit further comprises third and fourth field-effect transistors. The differential output transistor circuit comprises a combination of first, second, third, fourth and fifth bais components which are each resistive element or a field-effect transistors. Assume that the uninverted logic output signal is lowered to an 'L' level at a potential lower than that of the second differential output point. In this state, the fourth field-effect transistor of the second output transistor circuit performs a reversed operation, causing a drain current to flow to the output unit. Accordingly, the potential of the second differential output point is pulled down, displaying a feedback function that lowers back the gate potential of the third field-effect transistor of the second output transistor circuit and abruptly pulling up its 'L' to 'H' level.

6 Claims, 10 Drawing Sheets

LEVEL CONVERTING CIRCUIT

BACKGROUND OF THE INVENTION

1. Field of the Invention

The present invention relates to a level converting circuit. To put it in more detail, the present invention relates to improvement of a circuit for converting a logic-signal level, which is referred to hereafter as a MOS level, of a TTL (Transistor-Transistor Logic) circuit into a logic signal at an ECL (Emitter-Coupled Logic) level.

2. Description of the Related Art

In recent years, efforts are made to put enhanced performance and to embed more functions into semi-conductor integrated circuits which are also known as LSI devices. For example, there is a demand for electronic portable equipment driven by a battery that meets requirements such as that the equipment be small in size, have a light weight, be operatable using a low driving voltage and consume only little power. In addition, it is also required that a test cable employed in an LSI tester for testing such an LSI device be capable of transmitting a logic signal at an ECL level in order to increase the speed of the test operation. According to the conventional technology, however, a level converting circuit to which the present invention relates is a combination of an ECL output circuit comprising bipolar transistors and a level converter comprising field-effect transistors.

Therefore, when integrating such a level converting circuit into a single chip made of a semiconductor substrate, its manufacturing process becomes complicated, giving rise to a high production cost. Much like the ECL output circuit, a level converter can also be designed using bipolar transistors to simplify the manufacturing process. In an LSI device having bipolar transistors as its main components, however, power consumption can hardly be reduced.

Here, a technology embraced by a level converting circuit provided by the present invention is described. A configuration diagram of a level converting circuit embracing the technology provided by the present invention is shown in FIG. 1. FIG. 2 is a diagram showing operation wave forms of the level converting circuit.

In general, the level converting circuit comprises a level converter 1 driven by a −5[V] power-supply system and an ECL output circuit 2 driven by a −5.2[V] power-supply system. As shown in FIG. 1, the level converter 1 and the ECL output circuit 2 are connected to each other. A termination element 3 is connected to an output unit OUT of the level converting circuit.

The level converter 1 driven by the −5[V] power-supply system comprises field-effect transistors. The level converter 1 reduces a logic signal at a MOS level into a logic amplitude voltage for the ECL output circuit 2 which is driven by the 3[V] power-supply system. Receiving the logic input signal at a MOS level with a reduced voltage amplitude, e.g., an uninverted logic signal D and its associated inverted logic signal $\overline{D}$, the ECL output circuit 2 generates a logic output signal, for example, an uninverted logic signal Q and its associated inverted logic signal $\overline{Q}$.

The ECL output circuit 2 comprises a differential amplifier, a first bias component R11, a second bias component R12, a third bias component R13 a fourth bias component R14 and an output circuit. The differential amplifier further comprises a first bipolar transistor Q1, a second bipolar transistor Q2 and a third bipolar transistor Q3 whereas the output circuit comprises a fourth bipolar transistor Q4 and a fifth bipolar transistor Q5.

With the level converting circuit described above, the ECL output circuit 2 driven by the −5.2[V] power-supply system can output, for example, a 'H'-level (high-level) voltage VoH of the order of −0.9[V] and an 'L'-level (low-level) voltage VoL of the order of −1.7[V] to a transmission line having a characteristic impedance of 50 ohms without changing the −5.2[V] signal logic with a reduced voltage amplitude of the −5[V] power-supply system as shown in FIG. 2.

SUMMARY OF THE INVENTION

It is an object of the present invention to provide a level converting circuit which comprises field-effect transistors and no much-power consuming bipolar transistors and can convert a CMOS input signal level into a stabilized ECL output signal level.

It is another object of the present invention to shorten the rise and fall times of the wave form of the ECL output signal generated by the level converting circuit.

An embodiment that well implements the level converting circuit in accordance with the present invention comprises a differential output transistor circuit for amplifying a difference between mutually complementary input logic signals, a first output transistor circuit for outputting an inverted output logic signal based on a signal output by the differential output transistor circuit and a second output transistor circuit for outputting an uninverted output logic signal based on a signal output by the differential output transistor circuit. The differential output transistor circuit further comprises first and second input units for inputting the mutually complementary input logic signals, a first output unit connected to the first input unit, a second output unit connected to the second input unit and first and second differential output units for outputting the output signals.

The first output transistor circuit further comprises first and second field-effect transistors. The source of first field-effect transistor is connected to a positive power supply. The drain of the first field-effect transistor is connected to the drain of the second field-effect transistor. The gate of the second field-effect transistor is connected to the first output unit of the differential output transistor circuit. The gate of the first field effect transistor is connected to the source of the second field-effect transistor and the first differential output unit of the differential output transistor circuit.

The second output transistor circuit further comprises third and fourth field-effect transistors. The source of third field-effect transistor is connected to a positive power supply. The drain of the third field-effect transistor is connected to the drain of the fourth field-effect transistor. The gate of the fourth field-effect transistor is connected to the second output unit of the differential output transistor circuit.

The gate of the third field-effect transistor is connected to the source of the fourth field-effect transistor and the second differential output unit of the differential output transistor circuit.

With the circuit configuration described above, on-resistances can be varied by controlling the gate of the first field-effect transistor of the first output transistor circuit and the gate of the third field-effect transistor of the second output transistor circuit. In addition, by controlling the gates of the second and fourth field-effect transistors, bipolar transistors can be eliminated. The controlling of the gates of the first, second, third and fourth field-effect transistors allows a CMOS input signal level to be converted into a stabilized ECL output signal level. Feedbak functions displayed by the first and second output transistor circuits allow high-speed transistor operation to be obtained even if variations in threshold voltage exist due to variations in process for manufacturing the differential output transistor circuits.

DESCRIPTION OF THE PREFERRED EMBODIMENTS

Figure 1:
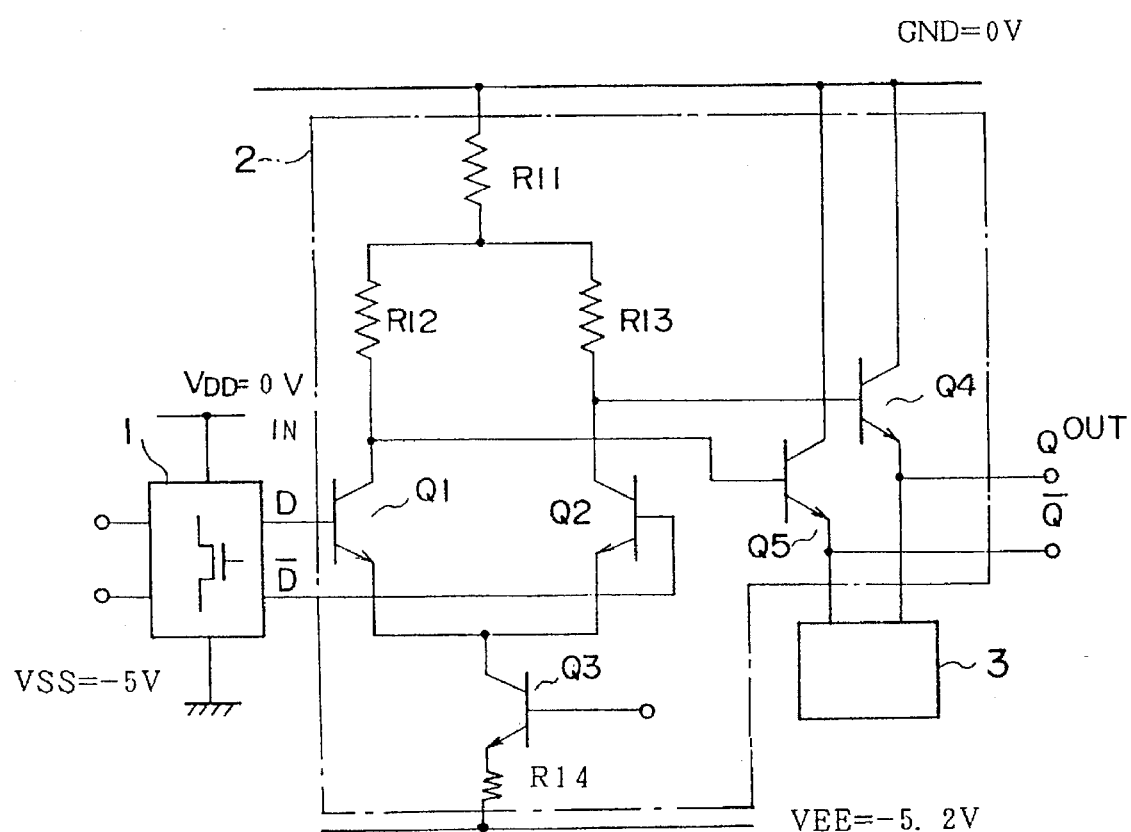
FIG. 1 is an explanatory diagram used for describing a level converting circuit embracing a technology provided by the present invention.
Figure 2:
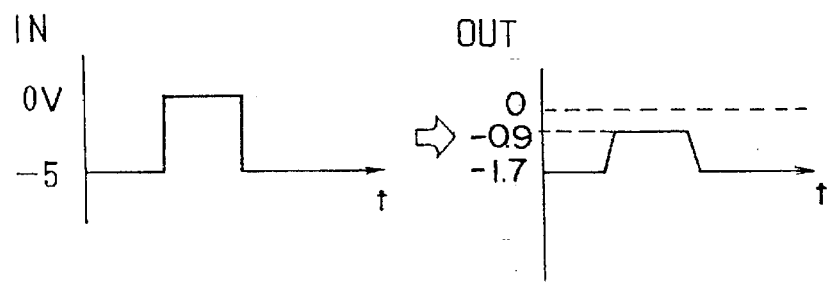
FIG. 2 shows operation wave forms of the level converting circuit shown in FIG. 1.
Figure 3:
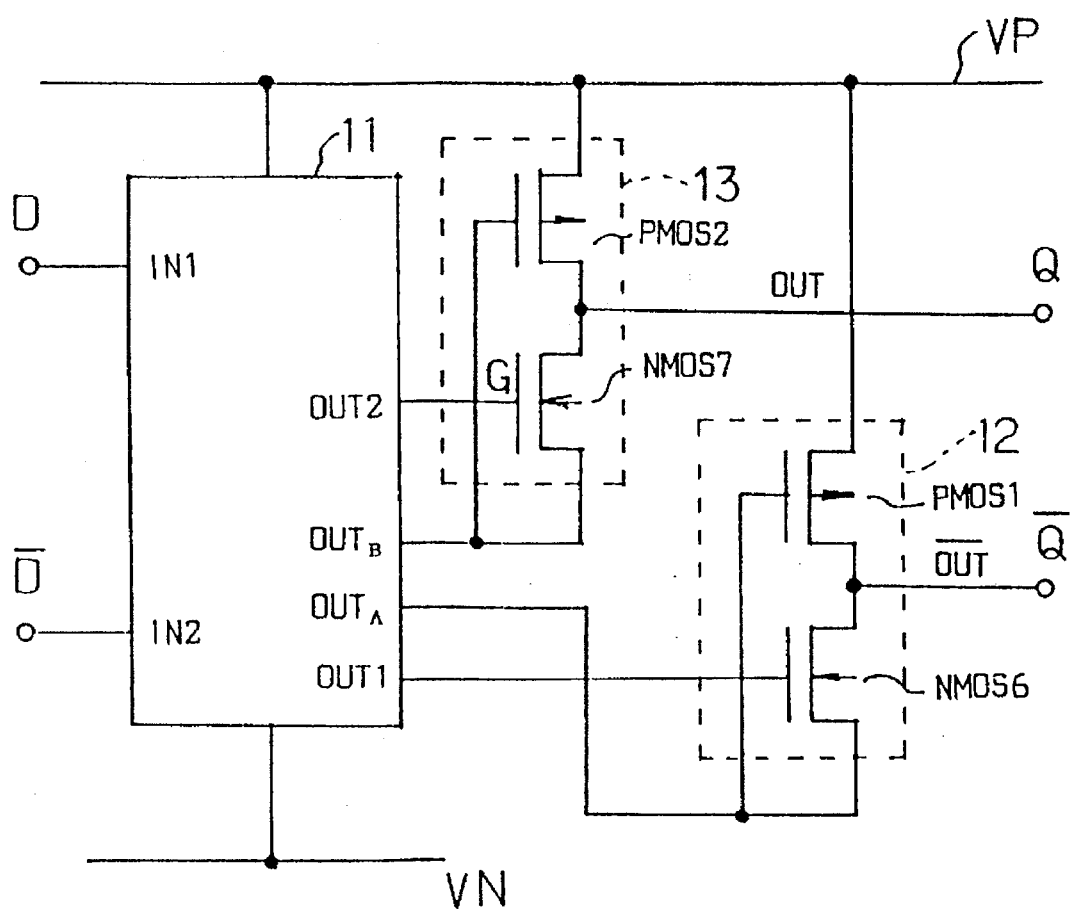
FIG. 3 is a diagram used for explaining the principle of operation of the level converting circuit provided by the present invention.
Figure 4:
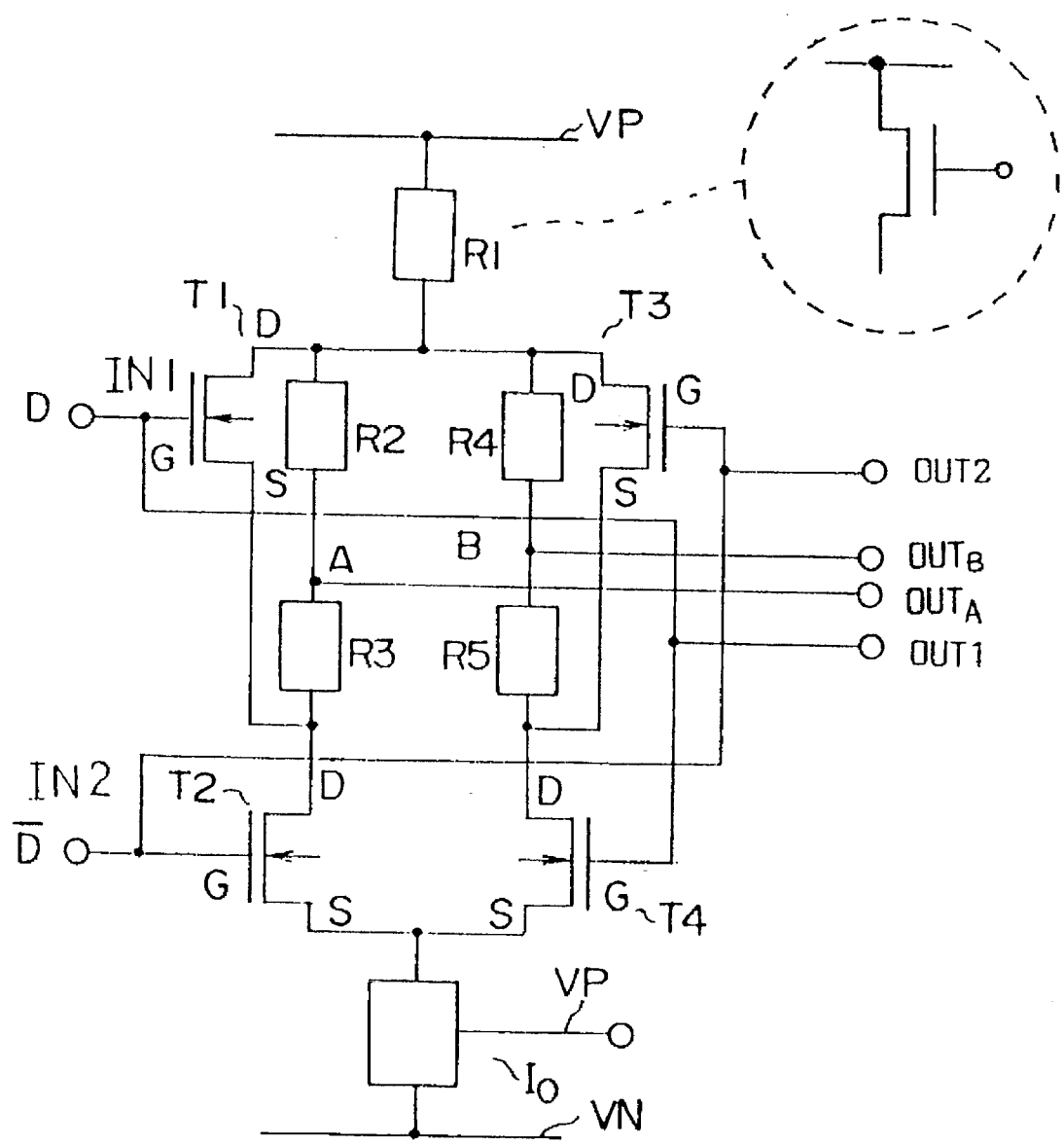
FIG. 4 is a diagram used for explaining the principle of operation of the differential output transistor circuit employed in the level converting circuit shown in FIG. 3.

FIG. 3 is a diagram used for explaining the principle of the operation of a level converting circuit provided by the present invention. FIG. 4 is a diagram used for explaining the principle of operation of the differential output transistor circuit employed in the level converting circuit shown in FIG. 3.

As shown in FIG. 3, the level converting circuit provided by the present invention comprises a differential output transistor circuit 11 for amplifying a difference between mutually complementary input logic signals D and $\overline{D}$ (the inverted signal of D), a first output transistor circuit 12 for outputting an inverted output logic signal $\overline{Q}$, a signal output as a result of the differential amplification, and a second output transistor circuit 13 for outputting an uninverted output logic signal Q, also a signal output as a result of the differential amplification.

The first output transistor circuit 12 further comprises first and second field-effect transistors PMOS1 and NMOS6. The drain D of the first field-effect transistor PMOS1 is connected to the drain D of the second field-effect transistor NMOS6 and an output unit OUT used for outputting the inverted output logic signal $\overline{Q}$.

The gate G of the second field-effect transistor NMOS6 is connected to a first output unit OUT1 of the differential output transistor circuit 11. The gate C of the first field-effect transistor PMOS1 is connected to the source S of the second field-effect transistor NMOS6 and a first differential output unit OUTA of the differential output transistor circuit 11.

The second output transistor circuit 13 further comprises third and fourth field-effect transistors PMOS2 and NMOS7. The source S of third field-effect transistor PMOS2 is connected to a positive power supply VP. The drain D of the third field-effect transistor PMOS2 is connected to the drain D of the fourth field-effect transistor NMOS7 and the output unit $\overline{OUT}$ for outputting the uninverted output logic signal Q.

The gate G of the fourth field-effect transistor NMOS7 is connected to a second output unit OUT2 of the differential output transistor circuit 11. The gate G of the third field-effect transistor PMOS2 is connected to the source S of the fourth field-effect transistor NMOS7 and a second differential output unit OUT$_B$ of the differential output transistor circuit 11.

It should be noted that the first and third field-effect transistors PMOS1 and PMOS2 employed in the level converting circuit provided by the present invention are both p-type field-effect transistors. On the other hand, the second and fourth field-effect transistors NMOS6 and PMOS7 are each a p-type field-effect transistor.

The differential output transistor circuit 11 provided by the present invention comprises first, second, third and fourth transistors T1 to T4, first, second, third, fourth and fifth bias components R1 to R5 and a constant-current supply Io. The drains D of the first and third transistors T1 and T3 are each connected to one end of the first bias component R1. The sources of the first and third transistors T1 and T3 are connected to the drains D of the second and fourth transistors T2 and T4 respectively. It should be noted that the sources S of the first and third transistors T1 and T3 are each connected to one terminal of the constantcurrent supply Io.

In addition, the gate G of the first transistor T1 is connected to the gate G of the fourth transistor the first output unit OUT1, and a first input unit IN1, which serves as an input point for the uninverted logic signal D. The gate G of the second transistor T2 is connected to the gate G of the third transistor T3, the second output unit OUT2, a second input unit IN2, which serves as an input point for the inverted logic signal $\overline{D}$.

Furthermore, the second and third bias components R2 and R3 are connected in series between the source S and the drain D of the first transistor T1. The first differential output OUT$_A$ is connected to the junction point between the second and third bias components R2 and R3. The fourth and fifth bias components R4 and R5 are connected in series between the source B and the drain D of the third transistor T3. The second differential output OUT$_B$ is connected to the junction point between the fourth and fifth bias components R4 and R5. The other end of the first bias component R1 is connected to a positive power supply VP. The constant-current supply Io is connected to the positive power supply VP and a negative power supply VN. The first, second, third, fourth and fifth transistors T1 to T4 employed in the level converting circuit provided by the present invention are each an n-type field-effect transistor. The constant-current supply Io is also built up using an n-type field-effect transistor. The first, second, third, fourth and fifth bias components R1 to R5 are each either a resistive element or a field-effect transistor.

Next, the principle of operation of the level converting circuit provided by the present invention is described. Let an uninverted logic signal D at the low level and an inverted logic signal $\overline{D}$ at the high level be supplied respectively to the first and second input units IN1 and IN2 of the differential output transistor circuit 11. It should be noted that the low and high levels are referred to hereafter as the 'L' and 'H' levels respectively. Such signals turn off the first and fourth transistors T1 and T4 of the differential output transistor circuit 11 and the second field-effect transistor NMOS6 of the first output transistor circuit 12.

However, the signals turn on the second and third transistors T2 and T3 of the differential output transistor circuit 11 and the fourth field-effect transistor NMOS7 of the second output transistor circuit 13. Accordingly, currents flow through the first, second and third bias components R1 to R3, the second transistor T2 and the constant-current supply Io, lowering the level of the first differential output point OUTA but raising the level of the second differential output point $OUT_B$.

Accordingly, the on-resistance of the third field-effect transistor PMOS2 of the second output transistor circuit 13 is increased while the on-resistance of the first field-effect transistor PMOS1 of the first output transistor circuit 12 is decreased. By connecting a termination element having a characteristic impedance of typically 50 Ω, differential ECL outputs comprising an uninverted logic output signal Q at the 'L' level and an inverted logic output signal $\overline{Q}$ at the 'H' level can be obtained. Note that the termination element is not shown in the figure.

During a transient period, in which the uninverted logic signal D goes from the 'H' level to the 'L' level and the inverted logic signal $\overline{D}$ goes reversely from the 'L' level to the 'H' level, the gate potential of the third field-effect transistor PMOS2 of the second output transistor circuit 13 is raised, increasing its on-resistance. Therefore, the uninverted logic output signal Q starts to fall. Immediately prior to the falling of the uninverted logic output signal Q, the fourth field-effect transistor NMOS7 of the second output transistor circuit 13 is turned on, pulling out electric charge. The electric charge raises the second differential output point $OUT_B$, allowing the falling time of the uninverted logic output signal Q to be shortened.

Assume that the uninverted logic output signal Q is lowered to an 'L' level at a potential lower than that of the second differential output point $OUT_B$. In this state, the fourth field-effect transistor NMOS7 of the second output transistor circuit 13 performs a reversed operation, causing a drain current to flow to the output unit OUT. Accordingly, the potential of the second differential output point OUTs is pulled down, displaying a feedback function that lowers back the gate potential of the third field-effect transistor PMOS2 of the second output transistor circuit 13 and pulls up abruptly its 'H' level.

In this way, the differential output signals are stabilized by a feedback circuit comprising the first and second output transistor circuits 12 and 13 even if variations in threshold voltage Vth exist due to variations in the process of manufacturing the differential output transistor circuit 11. Accordingly, stabilized output voltages VoL and VoH can be obtained from the un inverted logic output signal Q and the inverted logic output signal $\overline{Q}$ set at the 'L' and 'H' levels respectively.

Figure 5:
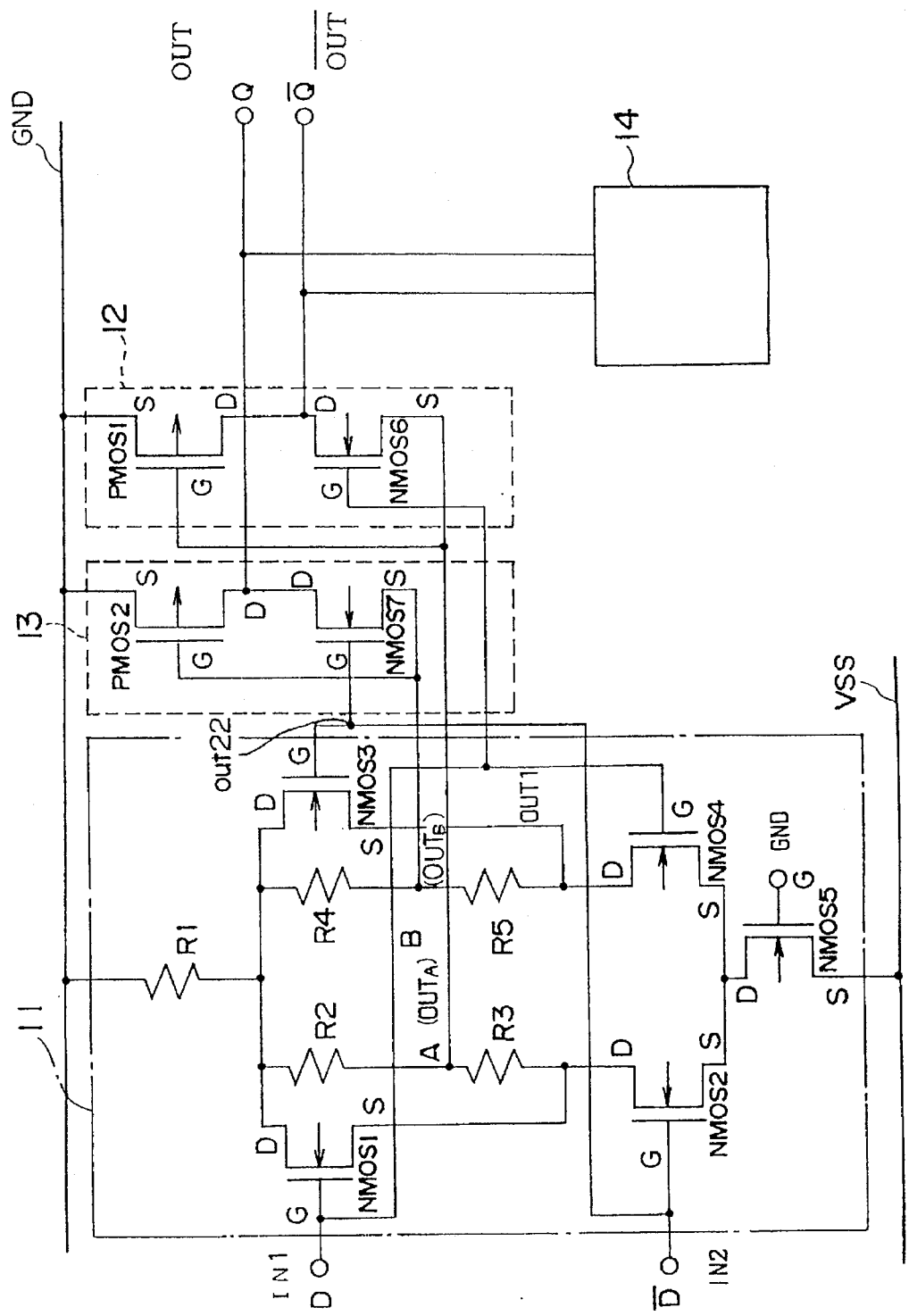
FIG. 5 shows the configuration of a representative embodiment implementing a CMOS differential ECL-level output circuit in accordance with the present invention.
Figure 6:
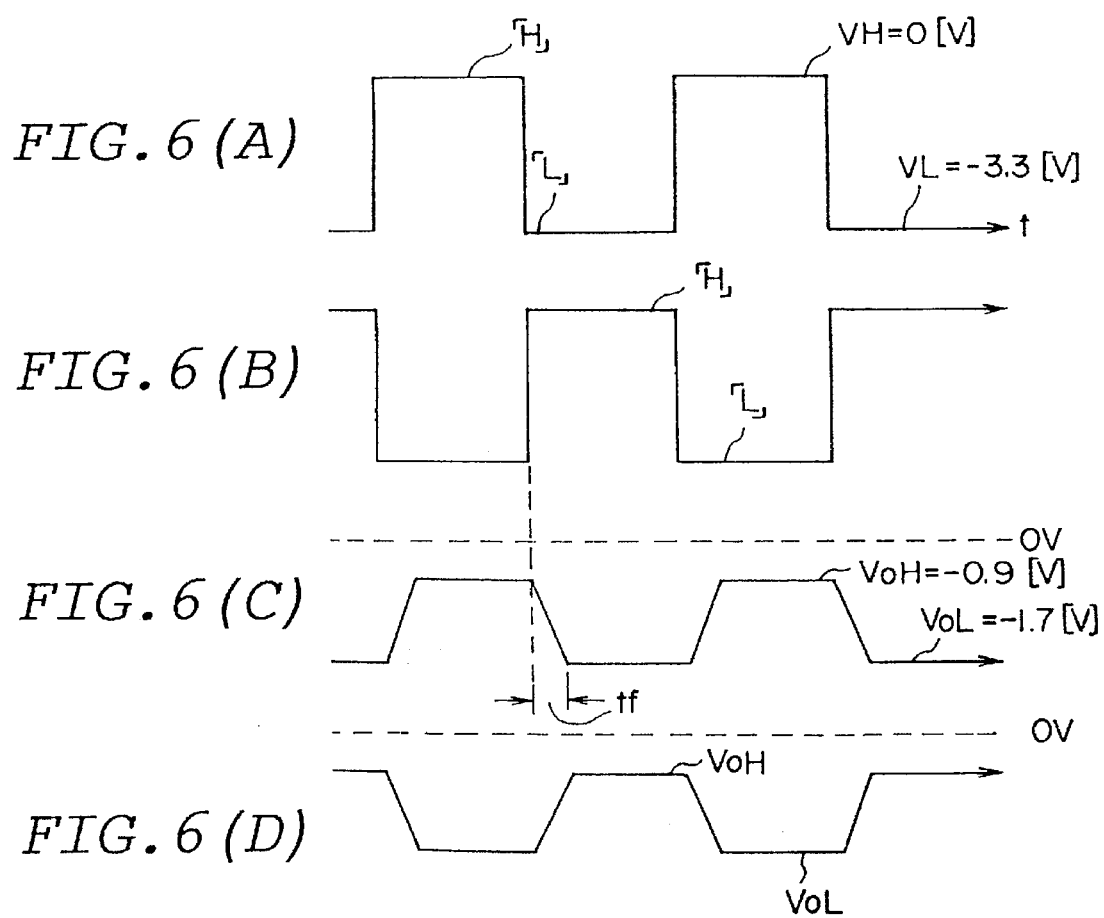
FIGS. 6 (A) to (D) are explanatory diagrams illustrating input/output voltages of the representative embodiment implementing the CMOS differential ECL-level output circuit in accordance with the present invention as shown in FIG. 5.
Figure 7:
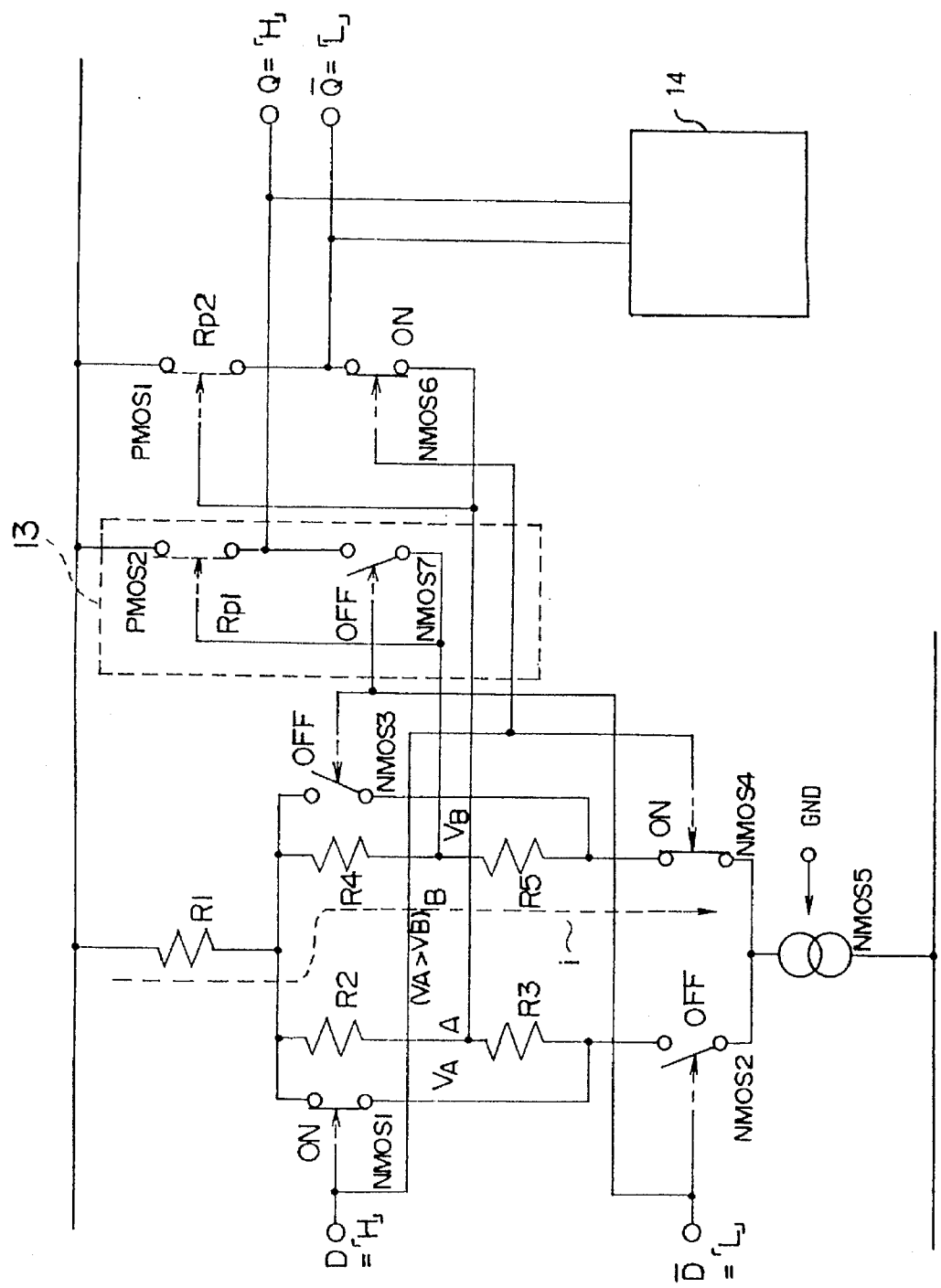
FIG. 7 is a diagram of an equivalent circuit used for explaining a steady-state (D='H' level, $\overline{D}$='L' level) operation of the representative embodiment implementing the CMOS differential ECL-level output circuit in accordance with the present invention as shown in FIG. 5.

Next, a representative embodiment implementing the level converting circuit in accordance with the present invention is described by referring to FIGS. 5 to 11. FIG. 5 shows the configuration of a representative embodiment implementing a CMOS differential ECL-level output circuit in accordance with the present invention. FIG. 6 (A) to (D) are explanatory diagrams illustrating input/output voltages of the representative embodiment which implements the CMOS differential ECL-level output circuit in accordance with the present invention as shown in FIG. 5. FIGS. 6 to 10 are diagrams showing equivalent circuits used for explaining the principle of operation of the representative embodiment which implements the CMOS differential ECL-level output circuit in accordance with the present invention as shown in FIG. 5. FIG. 11 is a wave-form diagram used for explaining a feedback operation of the representative embodiment shown in FIG. 5.

The CMOS differential ECL-level output circuit for directly converting a MOS level of a TTL circuit driven by a 3.3[V] power-supply system into a differential ECL level typically comprises a differential output transistor circuit 11, first and second output transistor circuits 12 and 13 and a termination element 14 as shown in FIG. 5.

As shown in the figure, the differential output transistor circuit 11 is connected between a 0-volt ground line GND serving as a typical positive power supply VP and a −3.3[V] power-supply line VSS serving as a typical negative power supply VN. The differential output transistor circuit 11 further comprises five n-type MOS transistors NMOS1 to NMOS5 and five resistors R1 to R5.

The transistor NMOS1, an example of the first transistor T1, is an n-type field-effect transistor. Its gate G is connected to the gate of the transistor NMOS4, and the input unit IN1 and the output unit OUT1 of the differential output transistor circuit 11. Note that the input unit IN1 is used for inputting an uninverted logic signal D.

In addition, the drain D of the transistor NMOS1 is connected to one end of each of the resistors R1, R2 and R4 and the drain D of the transistor NMOS3. The source S of the transistor NMOS1 is connected to the drain D of the transistor NMOS2 and one end of the resistor R3.

The transistor NMOS2, an example of the second transistor T2, is an n-type field-effect transistor. Its gate G is connected to the gate of the transistor NMOS3, and the input unit IN2 and the output unit OUT2 of the differential output transistor circuit 11. Note that the input unit IN2 is used for inputting an inverted logic signal $\overline{D}$. The source S of the transistor NMOS2 is connected to the the source S of the transistor NMOS4 and the drain D of the transistor NMOS5. The transistor NMOS3, an example of the second transistor T3, is an n-type field-effect transistor. As described above, its gate G is connected to the input unit IN2 of the differential output transistor circuit 11. In addition, its drain D is connected to the end of each of the resistor R1, R2 and R4 as described above. The source S of the transistor NMOS3 is connected to the drain D of the of the transistor NMOS4 and one end of the resistor R5.

The transistor NMOS4, an example of the second transistor T4, is an n-type field-effect transistor. As described earlier, its gate C is connected to the input unit IN1 and the output unit OUT1 of the differential output transistor circuit 11. The source S of the transistor NMOS4 is connected to the the source S of the transistor NMOS2 and the drain D of the transistor NMOS5 as described earlier.

The resistors R1 to R5 are examples of the first, second, third, fourth and fifth bias components respectively. The other end of the resistor R1 is grounded. The resistors R2 and R3 are connected in series between the source S and the drain D of the transistor NMOS1 and between the source S and the drain D of the transistor NMOS3. The first differential output $OUT_A$, which is referred to hereafter as a point A, is connected to the junction point between the resistors R2 and R3. The resistors R4 and R5 are connected in series between the source S and the drain D of the transistor NMOS3 and between the source S and the drain D of the transistor NMOS4. The second differential output $OUT_B$, which is referred to hereafter as a point B, is connected to the junction point between the resistors R4 and R5.

The resistance values of the five resistors R1 to R5 satisfy the following equations:

$$R1+R2+R3=R1+R4+R5$$

$$R2=R4$$

$$R3=R5$$

$$R0=V/I$$

where R0=R1+R2+R3, the sum of resistance values on either side of the first equation given above, V is a voltage obtained by subtracting a voltage drop across the transistor NMOS2 or NMOS4 and a voltage drop across the transistor NMOS5 from the power-supply voltage and I is a set current (or switching current) of the constant-current supply Io.

In addition, in order to set the 'L' level of the ECL output voltage to $-1.7[V]$, it is necessary to select a resistance value of the resistor R1 to give a potential of $-1.7[V]$ at the junction point between the resistor R1 and the resistor R2 or R4. A resistance value of the resistor R2 or R4 is further selected to give a potential of $-2.5[V]$ at the point A or B with the transistor NMOS2 or NMOS3 turned on. Polysilicon or diffusion resistors can be used as the five resistors RI to R5. It should be noted that a field-effect transistor can also be used to replace the resistor R1.

The transistor NMOS5, an example of the constantcurrent supply Io, is a transistor which sets the switching current I of the differential output transistor circuit 11. The switching current I is a circuit constant. The transistor NMOS 5 is a field-effect transistor. Its gate G is connected to the ground line GND whereas its source S is connected to the power-supply line VSS. As described earlier, its drain D is connected to the junction point of the sources of the transistors NMOS2 and NMOS4. The gate G of the transistor NMOS5 is connected to the ground line GND, which serves as a positive power supply, so as to allow the use of a rising common portion of the current-voltage characteristic displayed by the drain D of the transistor NMOS5. In this way, variations in threshold voltage Vth caused by variations in manufacturing process can be covered.

Furthermore, the output transistor circuits 12 and 13, which each serve as a supplementary circuit for the differential output transistor circuit 11, comprise first and second p-type MOS transistors PMOS1 and PMOS2, and sixth and seventh n-type MOS transistors NMOS6 and NMOS7.

The first output transistor circuit 12 comprises the transistors PMOS1 and NMOS6. The transistor PMOS1, a p-type field-effect transistor, is an example of the first field-effect transistor. The transistor NMOS6, an n-type field-effect transistor, is an example of the second field-effect transistor.

The gate G of the transistor NMOS6 is connected to the output unit OUT1 of the differential output transistor circuit 11 and, thus, also connected to the G of the transistor NMOS4 and the input unit IN1 of the differential output transistor circuit 11. The source S of the transistor NMOS6 is connected to the gate G of the transistor PMOS1 which is tied to the point A of the differential output transistor circuit 11. The wiring of the gate G of the transistor PMOS1 has been described above. The source S of the transistor PMOS1 is connected to the ground line GND. The drain D of the transistor PMOS1 is connected to the drain D of the transistor NMOS6 and the output unit $\overline{OUT}$ of the output transistor circuit 12 used for generating the inverted output logic signal $\overline{Q}$.

The second output transistor circuit 13 comprises the transistors PMOS2 and NMOS7. The transistor PMOS2, a p-type field-effect transistor, is an example of the third field-effect transistor. The transistor NMOS7, an n-type field-effect transistor, is an example of the fourth field-effect transistor.

The gate G of the transistor NMOS 7 is connected to the output unit OUT2 of the differential output transistor circuit 11 and, thus, also connected to the G of the transistor NMOS3 and the input unit IN2 of the differential output transistor circuit 11. The source S of the transistor NMOS7 is connected to the gate G of the transistor PMOS2 which is tied to the point B of the differential output transistor circuit 11. The wiring of the gate G of the transistor PMOS2 has been described above. The source S of the transistor PMOS2 is connected to the ground line GND. The drain D of the transistor PMOS2 is connected to the drain D of the transistor NMOS7 and the output unit OUT of the output transistor circuit 13.

It should be noted that the transistors PMOS1, PMOS2, NMOS6 and NMOS7 each have a withstand voltage higher than those of the transistors NMOS1 to NMOS5. The transistors PMOS1 and PMOS2 are larger in size than the transistors NMOS6 and NMOS7. Typically, a termination resistor having a characteristic impedance of 50 Ω is employed as the termination element 14 to give impedance matching with a circuit at the next stage.

Next, the foregoing of operation of the representative embodiment implementing the CMOS differential ECL level output circuit in accordance with the present invention is described by referring to FIGS. 5 to 11.

Let the uninverted logic signal D at an 'H' level of 0[V] and the inverted logic signal $\overline{D}$ at an 'L' level with a voltage amplitude of $-3.3[V]$ shown in FIG. 6 (A) and (B) be supplied respectively to the input units IN1 and IN2 of the differential output transistor circuit 11 shown in FIG. 5. In this case, the transistors NMOS1 and NMOS4 of the differential output circuit 11 and the transistor NMOS6 of the first output transistor circuit 12 are turned on as is obvious from an equivalent circuit for a steady-state operation shown in FIG. 7.

The transistors NMOS2 and NMOS3 of the differential output circuit 11 and the transistor NMOS7 of the second output transistor circuit 13 are, on the other hand, turned off. Accordingly, the switching current I flows through the resistors R1, R4 and R5 and the transistors NMOS2 and NMOS5, raising the voltage level VA of the point A to $-1.7[V]$ but conversely lowering the voltage level VB of the point B to $-2.5[V]$.

The on-resistance Rp2 of the transistor PMOS2 employed in the second output transistor circuit 13 is thus decreased while the on-resistance Rp1 of the transistor PMOS1 employed in the first output transistor circuit 12 is inversely increased. Typically, the on-resistance Rp2 is decreased from 200 Ω to a value of the order of 45 Ω while the on-resistance Rp1 is, on the contrary, increased from 45 Ω to a value of the order of 200 Ω.

Let, on the other hand, the uninverted logic signal D at an 'L' level and the inverted logic signal $\overline{D}$ at an 'H' level shown in FIG. 6 (A) and (B) be supplied respectively to the input units IN1 and IN2 of the differential output transistor circuit 11 shown in FIG. 5.

Figure 8:
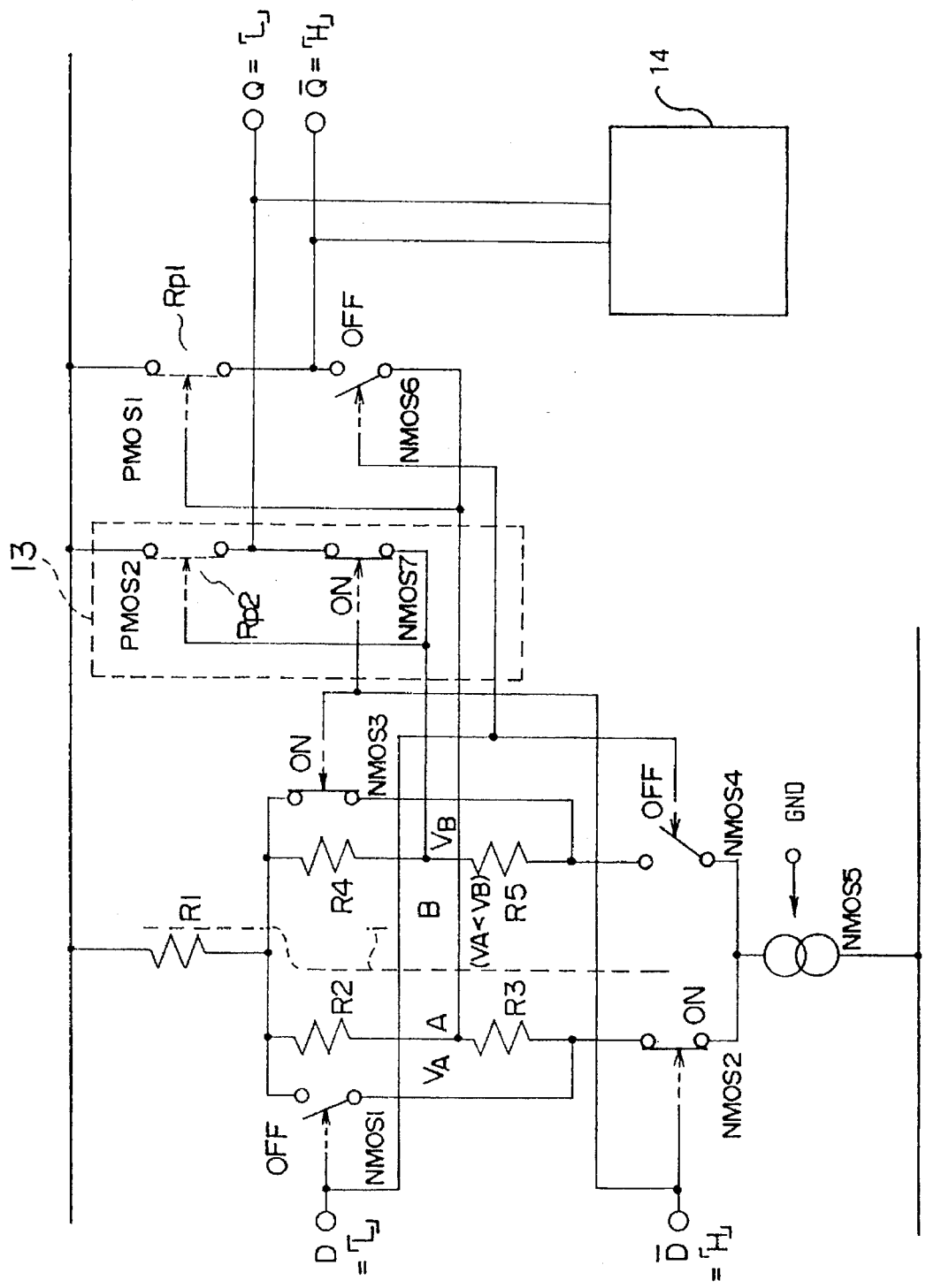
FIG. 8 is a diagram of an equivalent circuit used for explaining a steady-state (D='L' level, $\overline{D}$='H' level) operation of the representative embodiment implementing the CMOS differential ECL-level output circuit in accordance with the present invention as shown in FIG. 5.

In this case, the transistors NMOS1 and NMOS4 of the differential output circuit 11 and the transistor NMOS6 of the first output transistor circuit 12 are turned off as is obvious from an equivalent circuit for a steady-state operation shown in FIG. 8.

The transistors NMOS2 and NMOS3 of the differential output circuit 11 and the transistor NMOS7 of the second output transistor circuit 13 are, on the contrary, turned off. Accordingly, the switching current I flows through the resistors R1 to R3 and the transistors NMOS2 and NMOS5, raising the voltage level VB of the point B to −1.7[V] but conversely lowering the voltage level VA of the point A to −2.5[V].

The on-resistance Rp2 of the transistor PMOS2 employed in the second output transistor circuit 13 is thus increased while the on-resistance Rp1 of the transistor PMOS1 employed in the first output transistor circuit 12 is inversely decreased. Typically, the on-resistance Rp1 is decreased from 200 Ω to a value of the order of 45 Ω while the on-resistance Rp2 is, on the contrary, increased from 45 Ω to a value of the order of 200 Ω.

In this way, the characteristic impedance with a value of 50 Ω connected to the termination element 14 allows ECL differential output signals comprising the uninverted logic output signal Q at an 'L' level of −1.7[V] and the inverted logic output signal $\overline{Q}$ at an 'H' level of 0.9[V] to be produced as shown in FIG. 6 (C) and (D) respectively.

Figure 9:
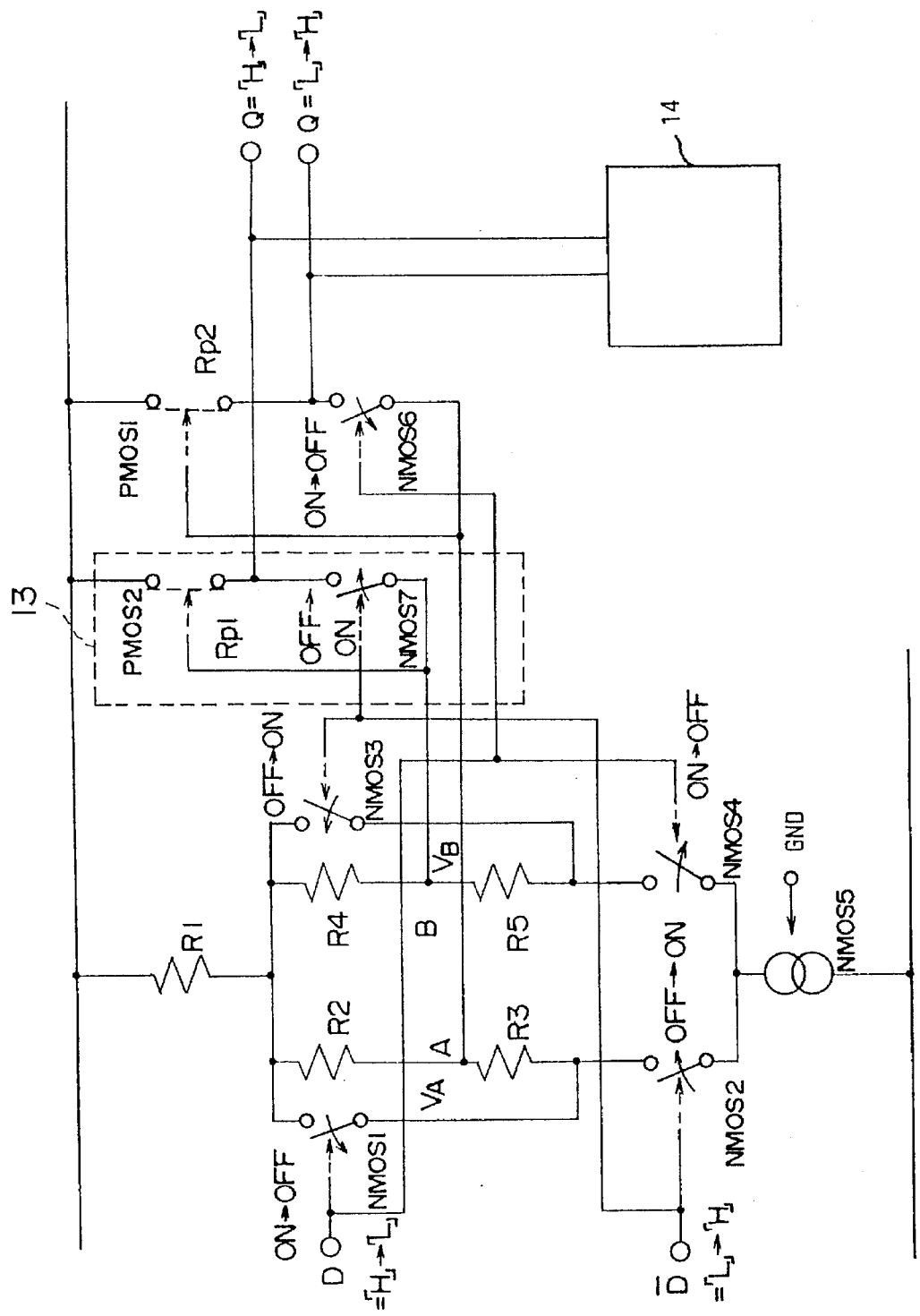
FIG. 9 is a diagram of an equivalent circuit used for explaining a transient-state (D='H' to 'L' level, $\overline{D}$='L' to 'H' level) operation of the representative embodiment implementing the CMOS differential ECL-level output circuit in accordance with the present invention as shown in FIG. 5.

During a transient period, in which the uninverted logic signal D goes from the 'H' level to the 'L' level and the inverted logic signal $\overline{D}$ goes reversely from the 'L' level to the 'H' level, the gate potential of the transistor PMOS2 of the second output transistor circuit 13 is raised as is obvious from an equivalent circuit for a transient state shown in FIG. 9, increasing its on-resistance Rp1 from 45 Ω to a value of the order of 200 Ω. Therefore, the uninverted logic output signal Q starts to fall. Immediately prior to the falling of the uninverted logic output signal Q, the transistor NMOS6 of the second output transistor circuit 13 is turned on, pulling out electric charge. The electric charge raises the potential VB of the point B at a high speed, allowing the falling time tf of the uninverted logic output signal Q to be shortened.

Here, the first and second output transistor circuits 12 and 13 play a role of supplementing the differential output transistor circuit 11 as is described below. Assume that the uninverted logic output signal Q is lowered to an 'L' level at a potential lower than the potential VB of the point B as shown in an equivalent circuit of FIG. 10. In this state, the fourth field-effect transistor NMOS7 of the second output transistor circuit 13 performs a reversed operation, causing a drain current to flow to the output unit OUT.

Figure 10:
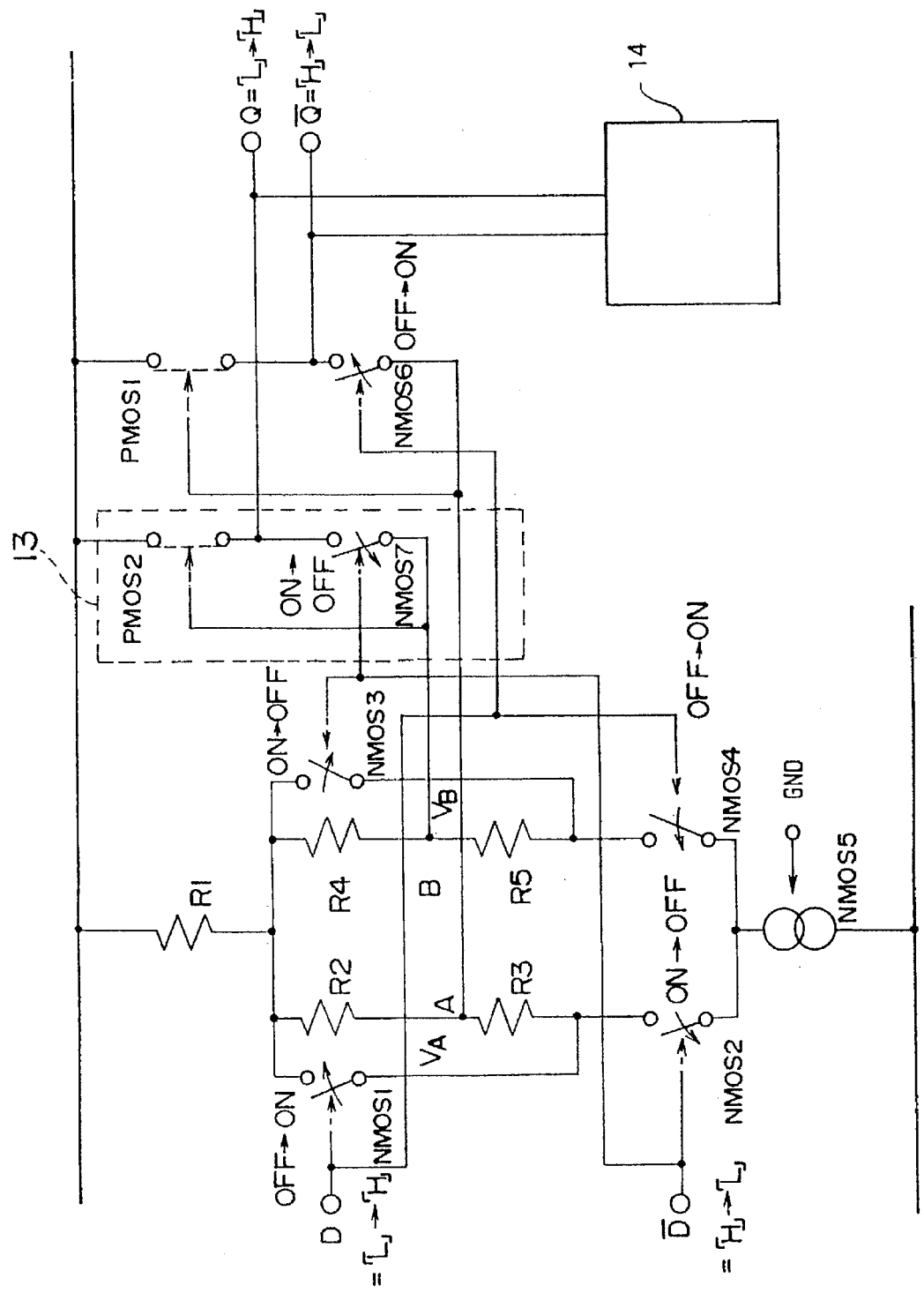
FIG. 10 is a diagram of an equivalent circuit used for explaining a transient-state (D='L' to 'H' level, $\overline{D}$='H' to 'L' level) operation of the representative embodiment implementing the CMOS differential ECL-level output circuit in accordance with the present invention as shown in FIG. 5.
Figure 11A:
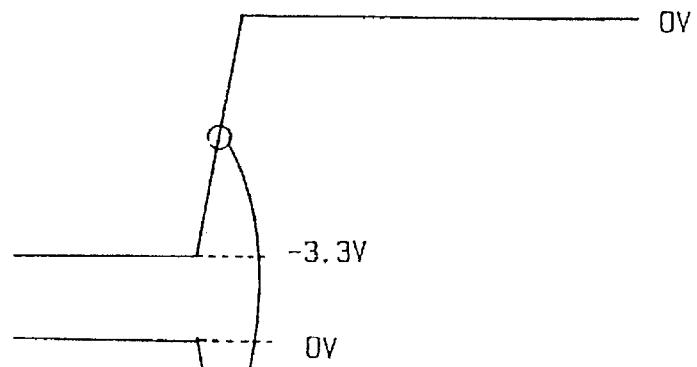
FIGS. 11 (a)–(f) are a wave-form diagram used for explaining a feedback operation of the representative embodiment implementing the CMOS differential ECL-level output circuit in accordance with the present invention as shown in FIG. 5.
Figure 11B:
Figure 11C:
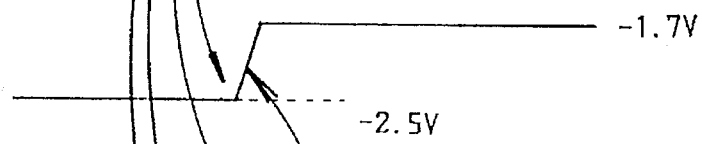
Figure 11D:
Figure 11E:
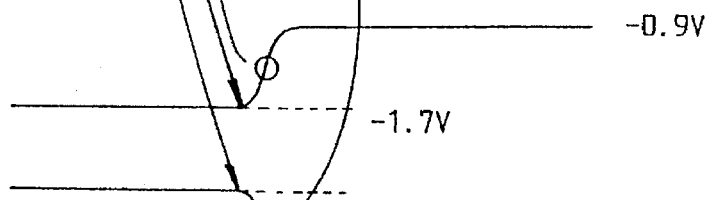
Figure 11F:
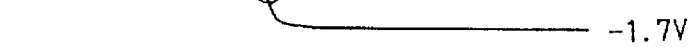

The rising of the uninverted logic input signal D shown in FIG. 11 (A) and the falling of the inverted logic input signal $\overline{D}$ shown in FIG. 11 (B) cause the potential level VB of the point B shown in FIG. 10 to go low. At that time, the uninverted logic output signal Q shown in FIG. 11 (E) rises, causing a feedback function to work. The feedback function lowers back the gate potential of the third field-effect transistor PMOS2 of the second output transistor circuit 13 and pulls up abruptly its 'L' to 'H' level. As a result, the potential level VB of the point B can be lowered abruptly as shown in FIG. 11 (D). At the time the uninverted logic output signal Q falls as shown in FIG. 11 (D), the potential level VA of the point A rises abruptly as shown in FIG. 11 (C).

In this way, the differential output voltages VA and VB are stabilized by a feedback circuit comprising the first and second output transistor circuits 12 and 13 even if variations in threshold voltage Vth exist due to variations in the process of manufacturing the differential output transistor circuit 11. Accordingly, stabilized output voltages VoL and VoH can be obtained from the uninverted logic output signal Q and the inverted logic output signal $\overline{Q}$ set at the 'L' and 'H' levels as shown in FIG. 6 (C) and (D) respectively.

Note that it is needless to say that it is quite possible to have a variety of modified versions other than the embodiment described above which are in the realm of the present invention. For example, the transistors NMOS1 and NMOS3 employed in the differential output transistor circuit for extracting electric charge can be eliminated if necessary. The resistor R1 can also replaced by a field-effect transistor. In this case, it is necessary to incorporate a field-effect transistor with a sufficient equivalent resistance value in order to give a stable resistance. Accordingly, all modified versions in a range not deviating from the true gists of the present invention are considered to be within the scope of the claims of the present invention.

What is claimed is:

1. A level converting circuit characterized by comprising:
   a differential output transistor circuit for amplifying a difference between two mutually complementary input logic signals;
   a first output transistor circuit for outputting an inverted output logic signal based on a signal output by said differential output transistor circuit; and
   a second output transistor circuit for outputting an uninverted output logic signal based on a signal output by said differential output transistor circuit, wherein
   said differential output transistor circuit further comprises:
      first and second input units for inputting said two mutually complementary input logic signals;
      a first output unit connected to said first input unit;
      a second output unit connected to said second input unit; and first and second differential output units for outputting said output logic signals,
   said first output transistor circuit further comprises first and second field-effect transistors with the source of said first field-effect transistor connected to a positive power supply, the drain of said first field-effect transistor connected to the drain of said second field-effect transistor, the gate of said second field-effect transistor connected to said first output unit of said differential output transistor circuit and the gate of said first field-effect transistor connected to the source of said second field-effect transistor and said first differential output unit of said differential output transistor circuit, and
   said second output transistor circuit further comprises third and fourth field-effect transistors with the source of said third field-effect transistor connected to a positive power supply, the drain of said third field-effect transistor connected to the drain of said fourth field-effect transistor, the gate of said fourth field-effect transistor connected to said second output unit of said differential output transistor circuit and the gate of said third field-effect transistor connected to the source of said fourth field-effect transistor and said second differential output unit of said differential output transistor circuit.

2. A level converting circuit according to claim 1 characterized in that said first and third field-effect transistors are each a p-type field-effect transistor and said second and fourth field-effect transistors are each an n-type field-effect transistor.

3. A level converting circuit according to claim 1 characterized in that:

said differential output transistor circuit comprises first, second, third and fourth switching transistors, first, second, third, fourth and fifth bias components for setting a circuit constant and a constant-current supply;

the drains of said first and third transistors are connected to one end of said first bias component, the source of said first transistor is connected to the drain of said second transistor, the source of said third transistor is connected to the drain of said fourth transistor, and the sources of said second and fourth transistors are connected to one end of said constant-current supply;

said second and third bias components are connected in series between the source and the drain of said first transistor, the junction point of the series connection between said second and third bias components is connected to said first differential output unit, said fourth and fifth bias components are connected in series between the source and the drain of said third transistor, and the junction point of the series connection between said fourth and fifth bias components is connected to said second differential output unit; and the other end of said first bias component is connected to a positive power supply and said constant-current supply is connected to a positive power supply and a negative power supply.

4. A level converting circuit according to claim 3 characterized in that said first, second, third and fourth transistors and said constant-current supply is each made up of an n-type field-effect transistor.

5. A level converting circuit according to claim 3 characterized in that said first, second, third, fourth and fifth bias components are each a resistive element or a field-effect transistor.

6. A level converting circuit according to claim 3 characterized in that said first bias component is a field-effect transistor.

\* \* \* \* \*